(12) United States Patent
Stefanoski

(10) Patent No.: US 7,428,150 B1
(45) Date of Patent: Sep. 23, 2008

(54) COMPUTING PLATFORM COMPONENT COOLING WITH QUICK DISCONNECT

(76) Inventor: Zoran Stefanoski, 255 King St., Apt. 533, San Francisco, CA (US) 94107

( * ) Notice: Subject to any disclaimer, the term of this patent is extended or adjusted under 35 U.S.C. 154(b) by 87 days.

(21) Appl. No.: 11/555,169

(22) Filed: Oct. 31, 2006

(51) Int. Cl.
*H05K 7/20* (2006.01)
*H01L 23/00* (2006.01)

(52) U.S. Cl. .................. 361/698; 361/687; 361/699; 361/719; 165/80.4; 165/80.5; 62/259.2

(58) Field of Classification Search .......... 361/687, 361/688, 698, 694–699, 715, 719–721; 165/80.4, 165/104.27, 104.29, 104.33, 104.34, 122, 165/185; 62/3.7, 259.2, 412, 418, 419, 426; 257/706, 707, 712–716, 721, 723, 724; 174/15.1, 174/16.1, 16.3, 252
See application file for complete search history.

(56) References Cited

U.S. PATENT DOCUMENTS

| | | | | |
|---|---|---|---|---|
| 4,133,022 A | * | 1/1979 | Moore et al. | 361/801 |
| 5,131,859 A | * | 7/1992 | Bowen et al. | 439/194 |
| 5,177,666 A | * | 1/1993 | Bland et al. | 361/689 |
| 5,740,018 A | * | 4/1998 | Rumbut, Jr. | 361/720 |
| 5,801,924 A | * | 9/1998 | Salmonson | 361/719 |
| 5,999,404 A | * | 12/1999 | Hileman | 361/699 |
| 6,616,469 B2 | * | 9/2003 | Goodwin et al. | 439/196 |
| 6,798,660 B2 | * | 9/2004 | Moss et al. | 361/699 |
| 6,888,720 B2 | * | 5/2005 | Pfister et al. | 361/689 |
| 7,151,667 B2 | * | 12/2006 | Walters et al. | 361/699 |
| 7,339,789 B2 | * | 3/2008 | Walters et al. | 361/699 |
| 2004/0008483 A1 | * | 1/2004 | Cheon | 361/687 |
| 2006/0187638 A1 | * | 8/2006 | Vinson et al. | 361/698 |

* cited by examiner

*Primary Examiner*—Michael V Datskovskiy
(74) *Attorney, Agent, or Firm*—Berkeley Law & Technology Group, LLP

(57) ABSTRACT

Embodiments for providing cooling for computing platform components are disclosed. In one example embodiment, a coolant may be provided from connector extending through a bracket to heat dissipation device thermally coupled to a processor mounted on a printed circuit board, wherein the printed circuit board and the bracket comprise a daughter card to be inserted into a connector on a motherboard of the computing platform.

19 Claims, 9 Drawing Sheets

COMPUTING PLATFORM COMPONENT COOLING WITH QUICK DISCONNECT

FIELD

The subject matter disclosed herein relates to the cooling of computing platform components.

BACKGROUND

As the size, density, power consumption, clock speed, and/or performance, of computing platform components continue to increase, heat dissipation issues may become more problematic. Other factors besides those examples mentioned above may also pose heat dissipation issues. Current solutions such as conventional heat sinks and/or fans may prove to be inadequate.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
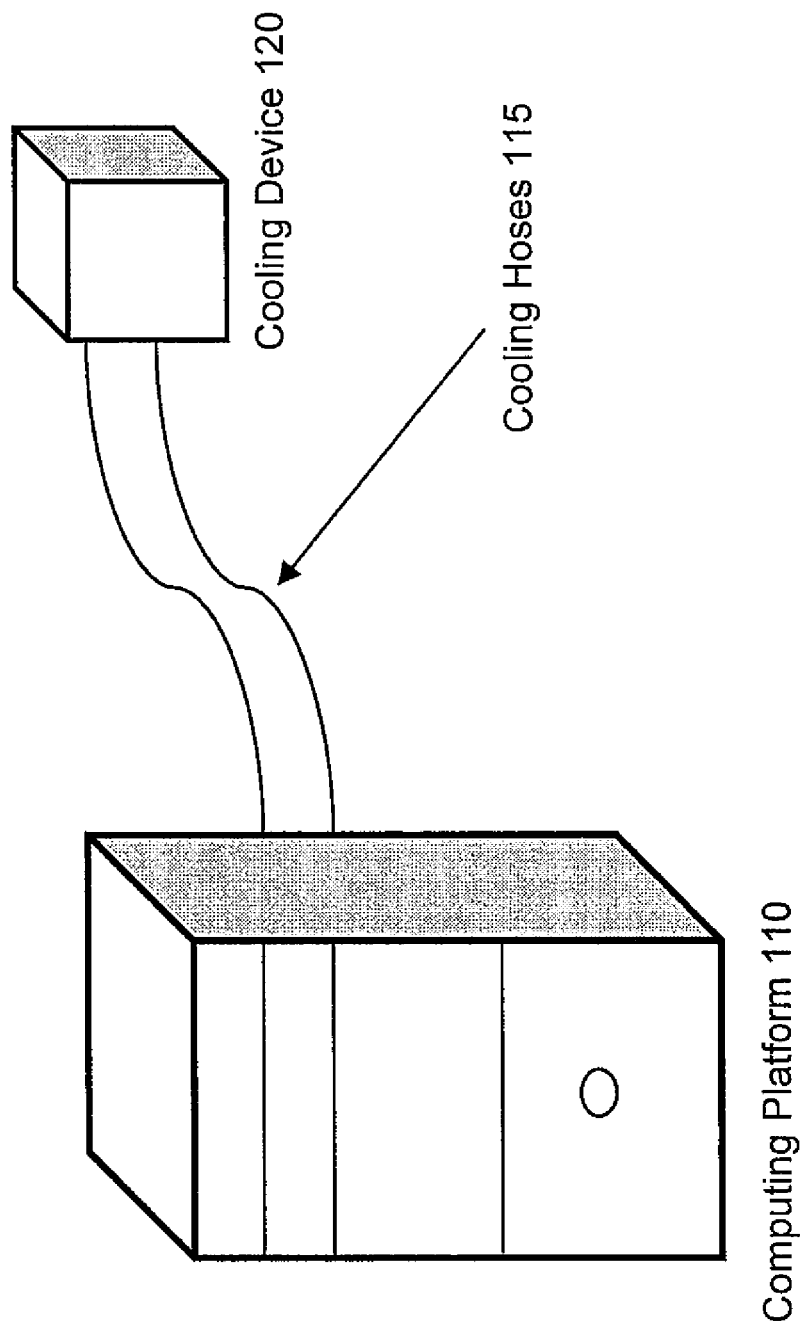
FIG. 1 is a diagram of an example embodiment of a system comprising a computing platform and a cooling device.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "maintaining," "representing," "modifying," "receiving," "transmitting," "storing," "authenticating," "authorizing," "hosting," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

The term "motherboard" as used herein is meant to include any printed circuit board (PCB) upon which any of a wide range of computing platform components may be installed. Further, as used herein the term "daughter card" is meant to include any PCB capable of being inserted into a connector on a motherboard.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other.

As used herein, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

FIG. 1 is a diagram of an example embodiment of a system comprising a computing platform 110 and a cooling device 120. Cooling device 120 may be coupled to computing platform 110 via cooling hoses 115. Cooling device may be capable of providing a coolant to computing platform 110 in order to aid in heat dissipation of one or more components within the computing platform. Examples of types of coolant that may be used in one or more embodiments may include liquids such as water, ethylene glycol, and/or mixtures of ethylene glycol and water, although the scope of the claimed subject matter is not limited in this respect. The coolant may also comprise a gas for one or more embodiments.

The types of components within computing platform 110 that may receive cooling in accordance with example embodiments described herein may include, but are not limited to, graphics processing units (GPU), central processing units (CPU), system logic devices, memory devices, etc. Further, cooling device 120 may comprise any device capable of allowing the dissipation of heat, such as, for example, a passive device such as a radiator or an active device such as a compressor. Cooling device 120 in one example embodiment may also comprise a pump to circulate coolant through the system. Of course, these are merely examples of types of cooling devices, and the scope of the claimed subject matter is not limited in these respects.

Figure 2:
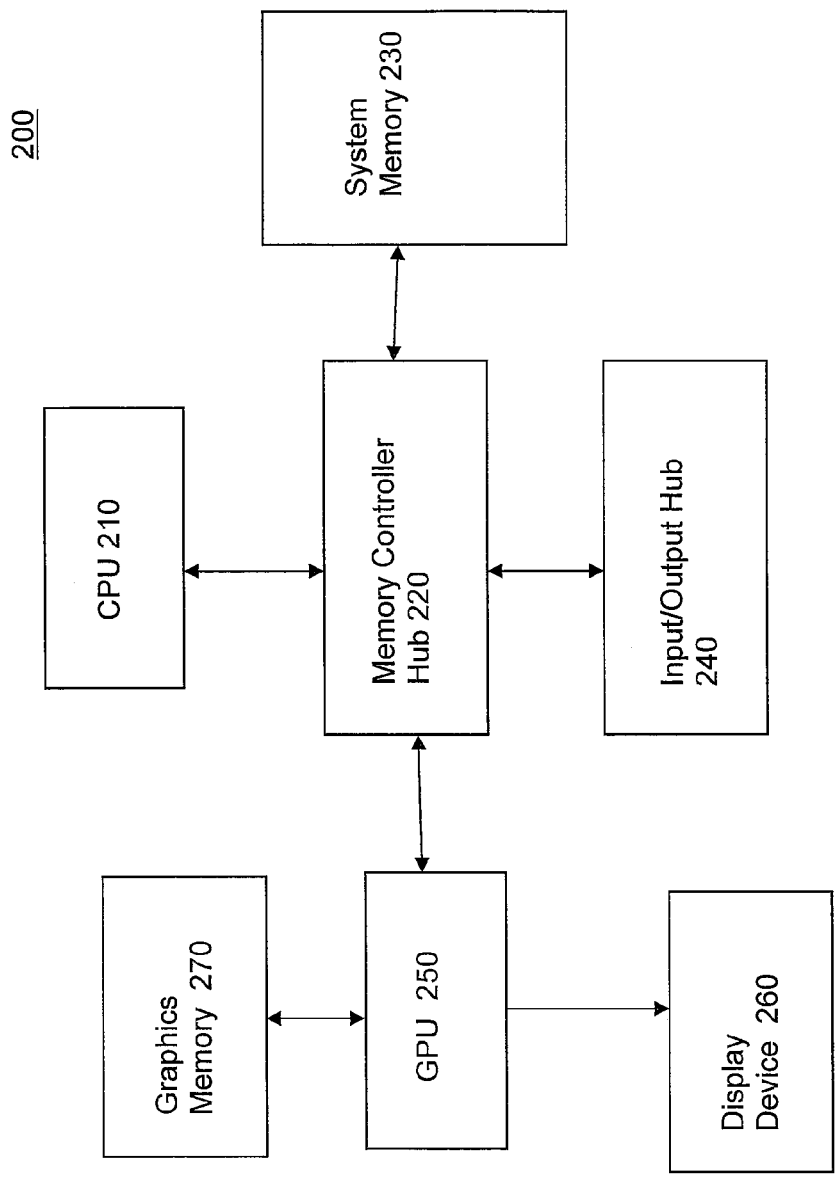
FIG. 2 is a block diagram of an example embodiment of a computing platform.

FIG. 2 is a block diagram of an example embodiment of a computing platform 200. Computing platform 200 may comprise a central processing unit (CPU) 210 and a memory controller hub 220 coupled to CPU 210. Memory controller hub 220 may be further coupled to a system memory 230, to a graphics processing unit (GPU) 250, and/or to an input/output hub 240. GPU 250 may be further coupled to a display device 260, which may comprise a cathode ray tube (CRT) display, a flat panel liquid crystal display (LCD), a projector, or other type of display device. Also coupled to GPU 250 may be a graphics memory 270. Platform 200 may also comprise one or more storage medium reading devices (not shown), perhaps coupled to input/output hub 240.

Although example system 200 is shown with a particular configuration of components, other embodiments are possible using any of a wide range of configurations. For example, embodiments are possible where a plurality of CPUs and/or GPUs are utilized. Further, the example embodiments described herein may be utilized in any of a wide range of electronic devices, including, but not limited to, computing platforms, gaming consoles and devices, televisions, set-top boxes, etc.

Example computing platform 200 may be incorporated into a system such as that described above in connection with FIG. 1. Any of the various components of platform 200 may be cooled according to example embodiments described herein.

Figure 3:
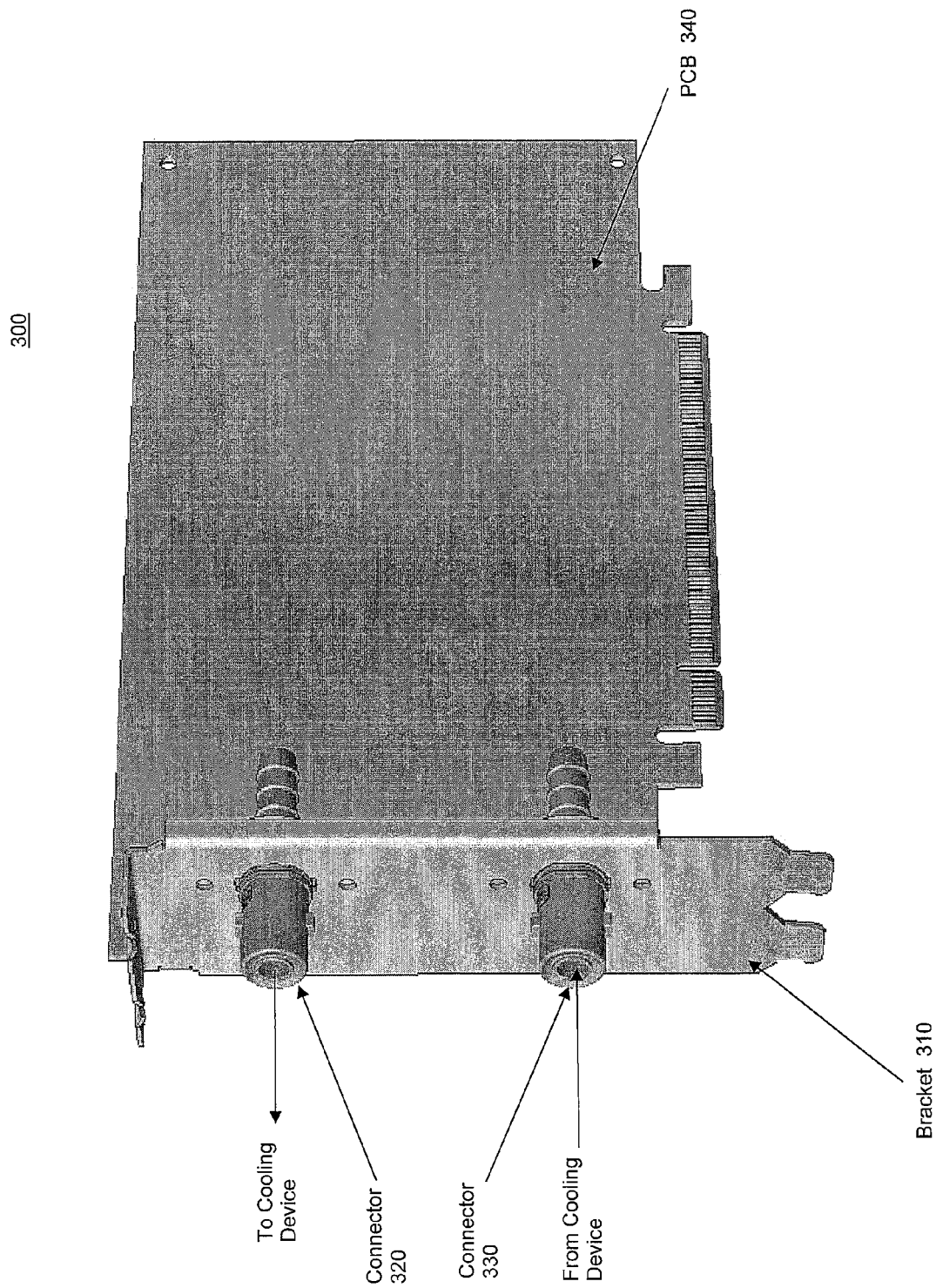
FIG. 3 is a perspective view of an example embodiment of a daughter card including connectors capable of receiving and/or expelling coolant.

FIG. 3 is a perspective view of an example embodiment of a daughter card 300 including connectors 320 and 330 capable of receiving and/or expelling coolant. For this example embodiment, connectors 320 and 330 are mounted on and extend through a bracket 310 that is connected to a PCB 340. For this example embodiment, bracket 310 may be capable of being attached to a computing system chassis. Also for this example embodiment, PCB 340 is capable of being inserted into a slot connector on a motherboard of a computing platform.

For this example embodiment, connectors 320 and 330 may comprise quick-disconnect connectors. Connectors 320 and 330 may also comprise leak-proof quick-disconnect connectors. Further, for one or more embodiments connectors 320 and 330 may be capable of receiving and/or expelling coolant via hoses. However, these are merely examples of the types, placement, and/or uses of connectors, and the scope of the claimed subject matter is not limited in these respects.

Although the embodiments described herein depict connectors for coolant as mounted to and/or extending through a bracket, other embodiments are possible where the connectors for the coolant are mounted to and/or extend through a computing platform chassis. Still other embodiments are possible where the connectors for the coolant are mounted to and/or extend through a computing platform housing.

Figure 4:
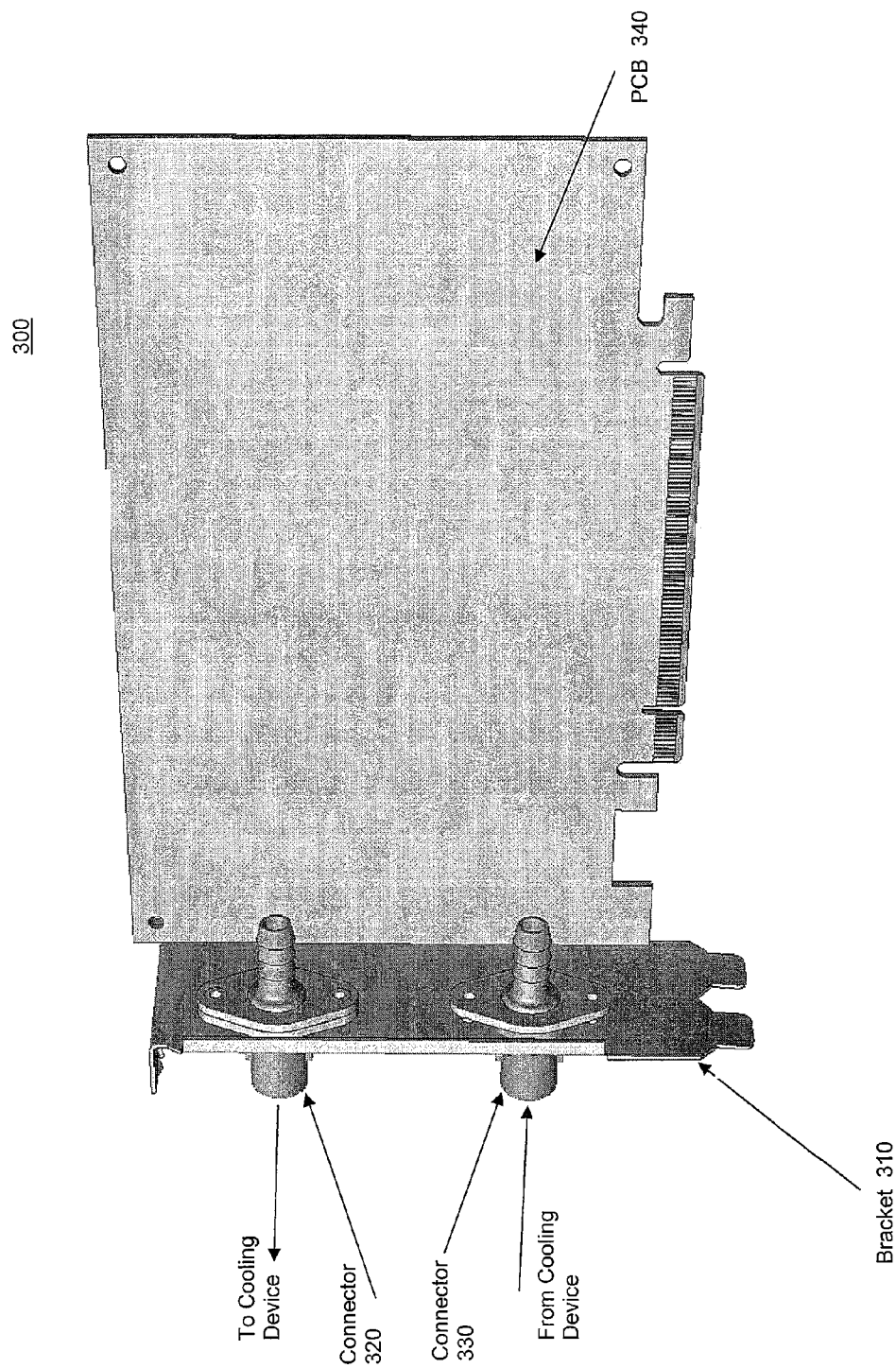
FIG. 4 is an alternate perspective view of an example embodiment of a daughter card including connectors capable of receiving and/or expelling coolant.

FIG. 4 is an alternate perspective view of example daughter card 300 including connectors 320 and 330, as well as bracket 310 and PCB 340.

Figure 5:
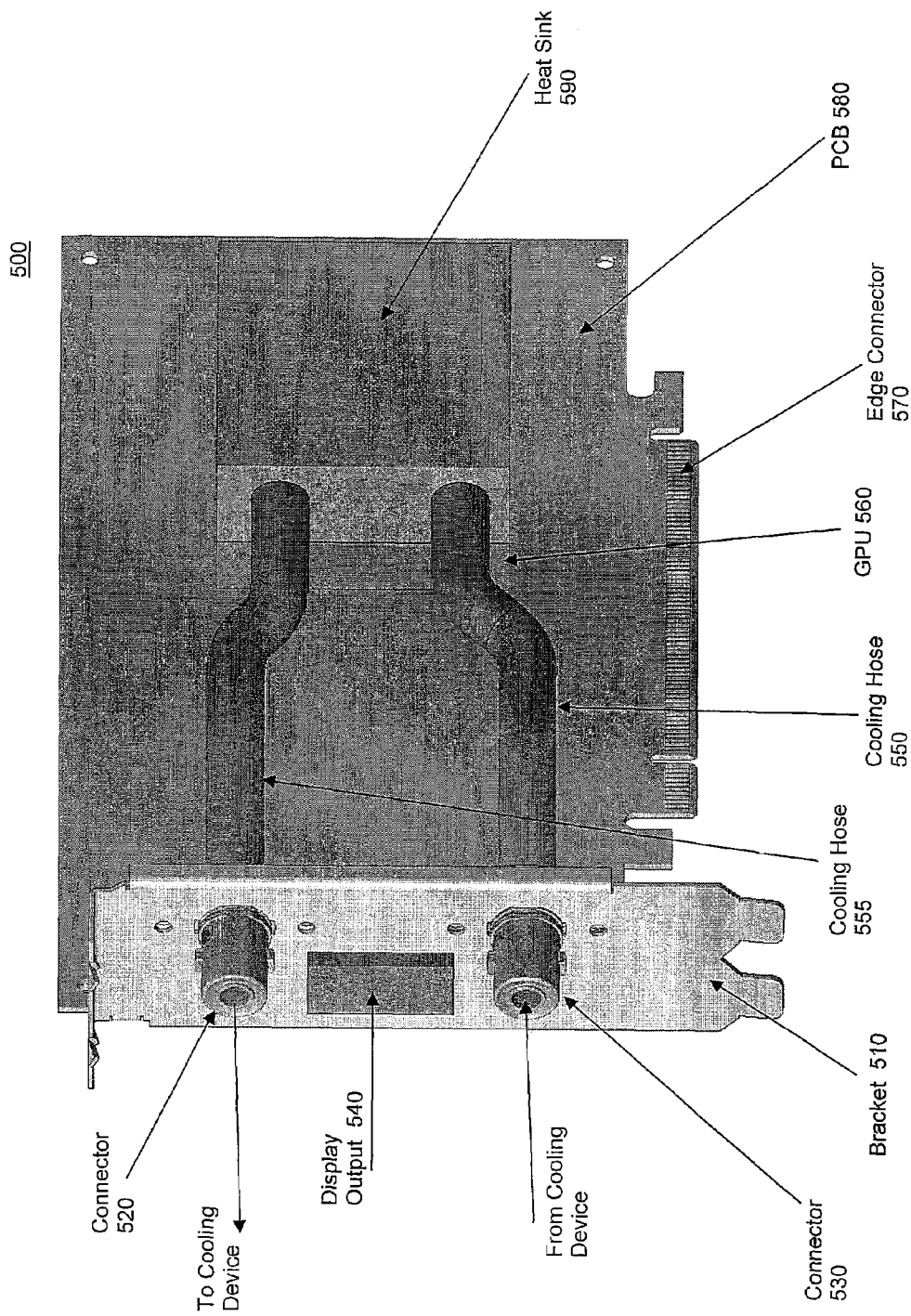
FIG. 5 is a perspective view of an example embodiment of a daughter card comprising a graphics processing unit and a heat sink.

FIG. 5 is a perspective view of an example embodiment of a daughter card 500 comprising a GPU 560 and a heat sink 590. For this example embodiment, heat sink 590 may be thermally coupled to GPU 560. Also for this example embodiment, heat sink 590 may comprise any component capable of having coolant pass through in order to dissipate heat away from a component such as GPU 560.

Example daughter card 500 for this embodiment may also comprise a bracket 510 coupled to a PCB 580. GPU 560 may be installed on the surface of PCB 580 or may be inserted into a socket mounted to the surface of PCB 580. PCB 580 may also comprise an edge connector 570 that may comprise a plurality of electrical contacts.

Bracket 510 may have connectors 520 and 530 extending through it. Connectors 520 and 530 may for one embodiment may comprise quick-disconnect, leak-proof connectors capable passing coolant from one end of the connector to another end. For this example, connector 530 may be capable of receiving coolant from a cooling device. The coolant may be delivered to heat sink 590 via a cooling hose 550. The coolant may exit heat sink 590 via a cooling hose 555 and pass through connector 520 on its way to the cooling device where the coolant may be again cycled back to connector 530.

Also for this example embodiment, daughter card 500 may comprise a display output connector 540. Display output connector 540 may provide electrical connection to a display device from GPU 560. Examples of display devices may include, but are not limited to, cathode ray tubes (CRT), liquid crystal displays (LCD), plasma displays, projectors, etc. Display output connector may comprise any connector type capable of interfacing with a display device. For other embodiments, any of a wide range of other types of electrical connectors may be mounted on and/or through bracket 510.

Although daughter card 500 has been described with a particular configuration of components and/or devices, any of a wide range of other embodiments are possible using other configurations of components and/or devices. Further, although embodiments described herein describe cooling a GPU, other embodiments are possible where cooling is providing to other computing platform components such as, for example, one or more CPUs. Of course, the scope of the claimed subject matter is not limited in this respect.

Figure 6:
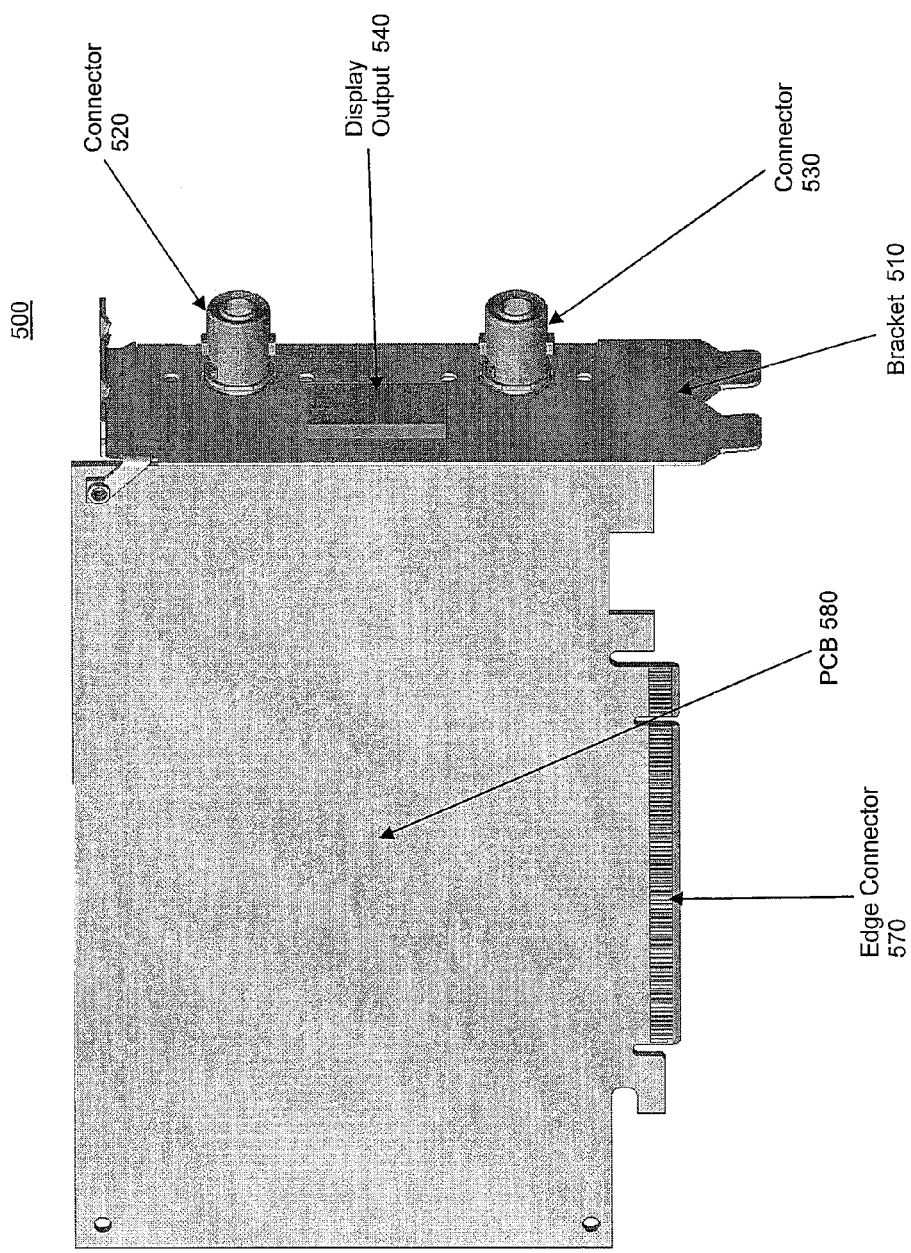
FIG. 6 is an alternate perspective view of an example embodiment of a daughter card comprising a graphics processing unit and a heat sink.

FIG. 6 is an alternate perspective view of example daughter card 500. In this view, a back side of PCB 580 is depicted, along with bracket 510, connectors 520 and 530, and display output connector 540. Edge connector 570 is also shown.

Figure 7:
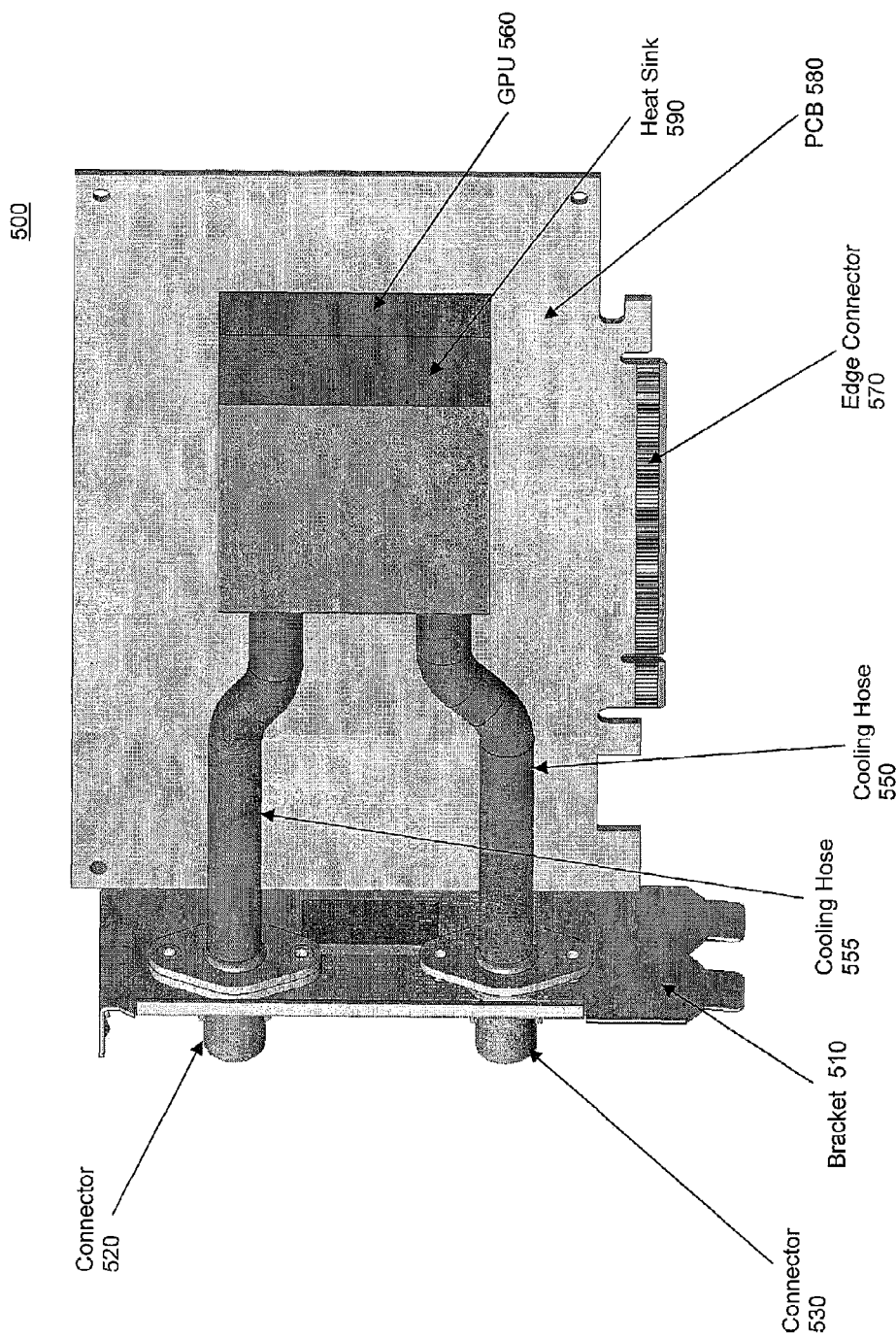
FIG. 7 is an additional alternate perspective view of an example embodiment of a daughter card comprising a graphics processing unit and a heat sink.

FIG. 7 is an additional alternate perspective view of example daughter card 500 comprising GPU 560 and heat sink 590. Also depicted are PCB 580, edge connector 570, bracket 510, and cooling hoses 550 and 555. Further depicted are connectors 520 and 530.

Figure 8:
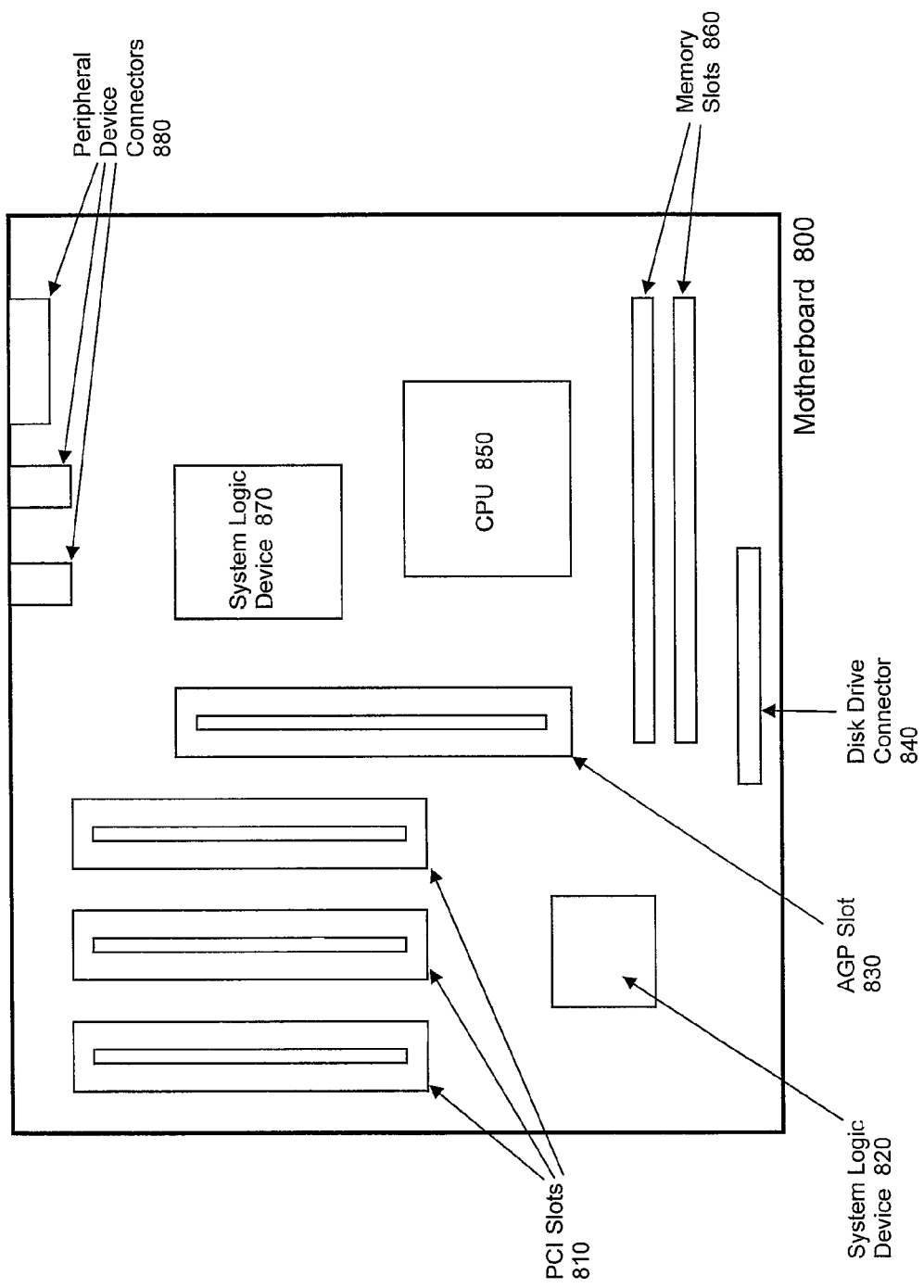
FIG. 8 is a block diagram of an example embodiment of a motherboard.

FIG. 8 is a block diagram of an example embodiment of a motherboard 800. For this example embodiment, motherboard 800 comprises a CPU 850, a system logic device 870, a system logic device 820, and an advanced graphics port (AGP) slot 830. Motherboard 800 also comprises memory slots 860 and disk drive connector 840. Several peripheral device connectors 880 are also shown. Also for this example embodiment, motherboard 800 comprises several peripheral component interconnect (PCI) slots 810. PCI slots 810 may receive one or more daughter cards. For one or more embodiments, one or more of PCI slots 810 may receive a daughter card such as daughter card 300 or 500 described above. Motherboard 800 may, for one or more embodiments, be installed within a computing platform chassis and/or housing, although the scope of the claimed subject matter is not limited in this respect.

Although motherboard 800 has been described with a particular configuration of computing platform components, other embodiments are possible with any of a very wide range of configurations and/or components.

Figure 9:
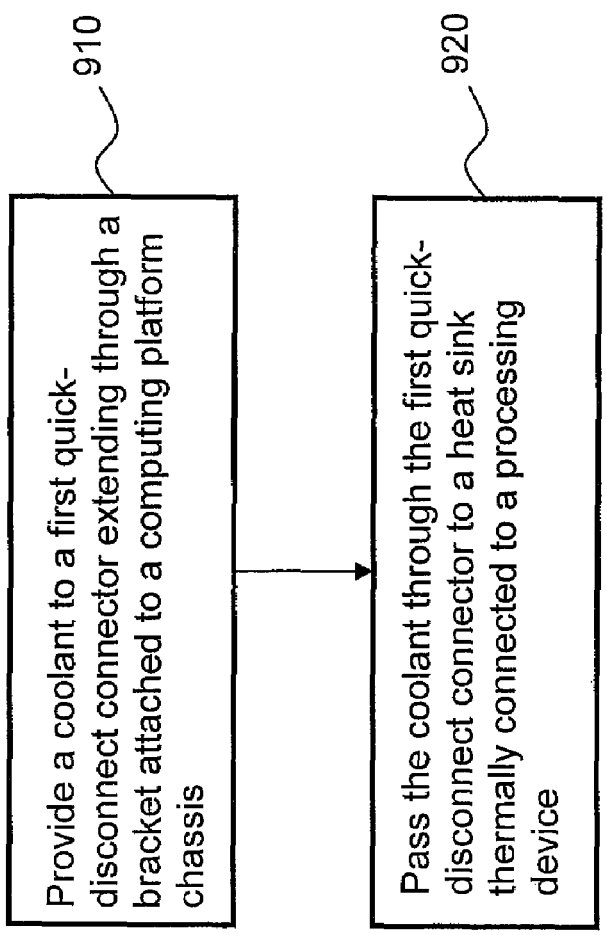
FIG. 9 is a flow diagram of an example embodiment for providing cooling for a processing device in a computing platform.

FIG. 9 is a flow diagram of an example embodiment for providing cooling for a processing device in a computing platform. At block 910, a coolant may be provided to a first quick-disconnect connector extending through a bracket attached to a computing platform chassis. The coolant may be passed through the first quick-disconnect connector to a heat sink that may be thermally connected to a processing device. An embodiment in accordance with claimed subject matter may include all, more than all, or less than all of blocks 910-920. Furthermore, the order of blocks 910-920 is merely one example order, and the scope of the claimed subject matter is not limited in this respect.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. An apparatus, comprising:
    a bracket to be attached to a computing platform;
    a first connector extending through the bracket, the first connector to pass a coolant from a first end of the connector to a second end of the connector;
    a printed circuit board coupled to the bracket, wherein the bracket and the printed circuit board comprise a daughter card to be inserted into a connector on a motherboard of the computing platform;
    a processor mounted on the printed circuit board; and
    a heat dissipation device thermally coupled to the processor, the heat dissipation device to receive the coolant from the second end of the first connector.

2. The apparatus of claim 1, wherein the first connector comprises a quick-disconnect type connector.

3. The apparatus of claim 2, wherein the first connector comprises a leak-proof quick-disconnect type connector.

4. The apparatus of claim 1, the bracket to be attached to a chassis of the computing platform.

5. The apparatus of claim 1, the bracket to be attached to a housing of the computing platform.

6. The apparatus of claim 1, wherein the processor comprises a graphics processing unit.

7. The apparatus of claim 1, wherein the heat dissipation device comprises a heat sink thermally coupled to the processor.

8. The apparatus of claim 1, the heat dissipation device to receive the coolant from a first hose coupled to the second end of the first connector.

9. The apparatus of claim 8, further comprising a second connector extending through the bracket, the second connector to receive the coolant from the heat dissipation device via a second hose coupled to the heat dissipation device.

10. A system, comprising:
    a computing platform, comprising:
        a motherboard,
        a bracket,
        a first connector extending through the bracket, the first connector to pass a coolant from a first end of the connector to a second end of the connector,
        a printed circuit board coupled to the bracket, wherein the bracket and the printed circuit board comprise a daughter card to be inserted into a connector on the motherboard,
        a processor mounted on the printed circuit board, and
        a heat dissipation device thermally coupled to the processor, the heat dissipation device to receive the coolant from the second end of the first connector; and
    a cooling device external to the computing platform coupled to the first end of the first connector via a first coolant hose, the cooling device capable of providing a coolant to the first connector through the first coolant hose.

11. The system of claim 10, wherein the first connector comprises a quick-disconnect type connector.

12. The system of claim 11, wherein the first connector comprises a leak-proof quick-disconnect type connector.

13. The system of claim 10, wherein the computing platform further comprises a chassis, and further wherein the bracket comprises a bracket to be attached to the computing platform chassis.

14. The system of claim 13, wherein the processor comprises a graphics processing unit.

15. The system of claim 10, wherein the heat dissipation device comprises a heat sink, the heat sink to receive the coolant from the first connector via a second coolant hose.

16. The system of claim 15, wherein the computing platform further comprises a second connector extending through the bracket, the heat sink to expel the coolant to the second connector via a third coolant hose, wherein the second connector is coupled to the cooling device via a fourth coolant hose.

17. A method, comprising:
    providing a coolant from a cooling device to a first connector extending through a bracket attached to a computing platform chassis;
    passing the coolant through a heat sink thermally connected to a processing device mounted to a printed circuit board coupled to the bracket, wherein the bracket and printed circuit board comprise a daughter card to be inserted into a connector on a motherboard of the computing system.

18. The method of claim 17, further comprising:
    expelling the coolant from the heat sink to a second connector extending through the bracket; and
    passing the expelled coolant from the second connector to the cooling device.

19. The method of claim 18, further comprising:
    cycling the coolant through the cooling device.

* * * * *